United States Patent
Nakano et al.

(10) Patent No.: US 6,628,818 B1
(45) Date of Patent: Sep. 30, 2003

(54) METHOD FOR RECOGNIZING IMAGES OF FINE WORK PIECES AND PICKUP APPARATUS EMPLOYING THE METHOD

(75) Inventors: Haruyuki Nakano, Shiga (JP); Wen Jye Chang, Shiga (JP)

(73) Assignee: NEC Machinery Corporation, Tokyo (JP)

( * ) Notice: Subject to any disclaimer, the term of this patent is extended or adjusted under 35 U.S.C. 154(b) by 0 days.

(21) Appl. No.: 09/538,478

(22) Filed: Mar. 30, 2000

(30) Foreign Application Priority Data

Mar. 31, 1999 (JP) .............................. 11-091469

(51) Int. Cl.[7] .......................... G06K 9/00; G01R 31/26
(52) U.S. Cl. .......................................... 382/149; 438/17
(58) Field of Search ................................. 382/145, 141, 382/144, 147, 149, 108, 151; 438/14–18

(56) References Cited

U.S. PATENT DOCUMENTS

| | | | | |
|---|---|---|---|---|
| 4,628,531 A | * | 12/1986 | Okamoto et al. | 382/144 |
| 4,861,162 A | * | 8/1989 | Ina | 356/401 |
| 5,329,334 A | * | 7/1994 | Yim et al. | 355/53 |
| 5,461,237 A | * | 10/1995 | Wakamoto et al. | 250/548 |
| 5,561,606 A | * | 10/1996 | Ota et al. | 716/19 |
| 5,654,632 A | * | 8/1997 | Ohno | 324/158.1 |
| 5,673,208 A | * | 9/1997 | Meier et al. | 702/179 |
| 5,692,070 A | * | 11/1997 | Kobayashi | 382/145 |
| 5,787,190 A | * | 7/1998 | Peng et al. | 382/145 |
| 5,793,471 A | * | 8/1998 | Kanda et al. | 355/53 |
| 5,874,189 A | * | 2/1999 | Stroh et al. | 430/22 |
| 5,881,888 A | * | 3/1999 | Ohkawara et al. | 209/552 |
| 5,926,690 A | * | 7/1999 | Toprac et al. | 438/17 |
| 5,946,408 A | * | 8/1999 | Honda | 382/149 |
| 6,122,397 A | * | 9/2000 | Lee et al. | 382/149 |
| 6,324,298 B1 | * | 11/2001 | O'Dell et al. | 382/149 |
| 6,417,014 B1 | * | 7/2002 | Lam et al. | 438/14 |
| 2002/0181757 A1 | * | 12/2002 | Takeuchi | 382/149 |

FOREIGN PATENT DOCUMENTS

| | | | | |
|---|---|---|---|---|
| JP | 356098835 | * | 8/1981 | |
| JP | 3560988835 A | * | 8/1981 | ........... H01L/21/58 |
| JP | 9-17841 | | 1/1997 | ........... H01L/21/68 |

* cited by examiner

Primary Examiner—Leo Boudreau
Assistant Examiner—Shefali Patel
(74) Attorney, Agent, or Firm—Sughrue Mion, PLLC

(57) ABSTRACT

Based on the result of image recognition of the first wafer, the scan area of image recognition in the second and later wafers is determined. For example, in an appearance inspection process of semiconductor pellets, the first wafer is scanned over for image recognition to determine a contour (hereinafter referred to as the polygon) of a set constituted by pellets excluding non-shaped pellets as the scan area for the second and later wafers. This allows for reducing the scan area for the second and later wafers, thereby eliminating unnecessary areas to scan and saving time and costs required for the work.

14 Claims, 6 Drawing Sheets

METHOD FOR RECOGNIZING IMAGES OF FINE WORK PIECES AND PICKUP APPARATUS EMPLOYING THE METHOD

BACKGROUND OF THE INVENTION

1. Technical Field of the Invention

The present invention relates to a method for recognizing a fine work piece and a pickup apparatus employing the method, in particular to a method for recognizing a fine work piece and a pickup apparatus employing the method, which is used, in semiconductor fabrication processes, to inspect the appearance of pellets diced in a dicing process, to determine whether the pellet is good or bad, to pick up a good pellet, and to transport it to a mounting process.

2. Description of the Related Art

The pellet mounting process, part of semiconductor device fabrication processes, includes a step for inspecting, by image recognition, the appearance of a plurality of semiconductor pellets (hereinafter referred to as pellets) that has been obtained by dividing a semiconductor wafer (hereinafter referred to as the wafer) in a grid pattern in the previous dicing process, a step for picking up only good pellets after inspection, a step for transporting the pellets to a predetermined position, and a step for mounting the pellets on a lead frame. Conventionally, methods and apparatuses employed in these steps include, for example, a technique disclosed in Japanese Patent Laid-Open Publication No.Hei 09-017,841.

FIGS. 1 and 2 show the conventional image recognition method and pickup apparatus disclosed in the above publication. A wafer 2 is divided into a grid pattern on an adhesive sheet 3, resulting in a plurality of pellets 1 arranged regularly. Thereafter, the adhesive sheet is stretched in a radial direction from the center thereof towards the circumference thereof and then attached to a wafer ring with the adhesive sheet being stretched. As the result, the pellets 1 are arranged regularly, kept at their relative positions as they were at the time of division of the wafer and spaced a little away from one another. The regularly arranged pellets 1 and the adhesive sheet 3 are loaded on an X-Y movable table 12 together with the wafer ring 4. At the time of loading the pellets 1, the center of the wafer ring 4 is so positioned as to sit on a fixed point on the X-Y coordinates of the X-Y movable table 12.

Subsequently, a drive control portion 11 drives the X-Y movable table 12 by the pitch based on the distance between the pellets 1, which has been set at a fixed value. This allows each of the pellets 1 of the wafer 2 to be scanned as shown by arrow 5 in FIG. 1, and one of the pellets 1, is recognized and positioned at a pickup position. Thereafter, the pellet 1 is imaged by means of a camera 8 and then the image signal obtained by the imaging is processed in an image-processing portion 9. The image-processing portion 9 digitizes the image signal, which is in turn stored as image data in an image storage portion 10, and determines whether the chip is good or bad, based on the data and recognizes the position of the chip from the image. Thus, the appearance of the pellet 1 is inspected. In cases where the pellet 1 has been determined to be a good pellet 1a without scratches and chips as the result of the appearance inspection, a collet 7 picks up a pellet 1a that has been determined to be good. Then, the collet 7 transports the good pellet 1a to a point above a lead frame 13 and then place the good pellet 1a on a predetermined mounting position of the lead frame 13. Thus, the pellet 1a is mounted on the lead frame 13.

The scan area of the wafer for image recognition is a circle 15 (shown by chain double-dashed lines) with a radius larger than that of the wafer 2. The scan path is shown by arrow 5 in FIG. 1. That is, the first column is scanned starting with the upper edge portion of the circle 15 in the direction of +X. When the scan has reached the circle 15, the scan of the first column is completed. Then, the scan position is shifted by one column in the direction of -Y along the circle 15 and thus the next column is scanned in the direction of -X, which is opposite to that of the previous column. This scanning pattern is repeated and thus the entire area inside the circle 15 is scanned. All of the pellets 1 are inspected by image recognition and good pellets 1a are all mounted. Thereafter, the wafer 2 is removed from the X-Y movable table 12 together with the wafer ring 4 and the next wafer 2 is positioned on the X-Y movable table 12 together with the wafer ring 4 to be placed thereon. Then, the same operation of picking up pellets 1 is repeated.

However, the range of scan is set to within the circle 15 that has a radius larger than the wafer 2. In the operation of picking up pellets 1, this causes the scan range to include regions, where no pellets exist, and the outer rim of the circumference of the wafer, where there exist not rectangular but chipped defective pellets (hereinafter referred to as non-shaped pellets). Thus, there is the problem of wasted time in the image recognition portion.

The reason why the range of scan is set to a circle having a radius larger than that of a wafer is typically because the center of the wafer does not coincide with that of the wafer ring. This is because, when the wafer is diced into a grid pattern on an adhesive sheet to be thus divided into a plurality of pellets and thereafter the adhesive sheet with the regularly arranged pellets adhered thereto is attached to the wafer ring with the adhesive sheet being stretched, the adhesive sheet cannot be always attached to the wafer ring with the center of the wafer ring being coincident with that of the wafer. Moreover, when the adhesive sheet is stretched outwards in a radial direction from the center of the wafer ring after dicing in order to ensure positive separation of pellets from one another, the center of the wafer would be displaced from that of the wafer ring.

As such, the center of the wafer is possibly displaced from that of the wafer ring when the wafer (divided pellets) is attached to the wafer ring and the adhesive sheet is stretched outwards radially from the center of the wafer. Accordingly, the area of scan had to be set to a circle larger than the wafer in order to ensure positive scanning of the entire portion of the wafer.

SUMMARY OF THE INVENTION

The object of the present invention is to provide a method for recognizing images of fine work pieces and a pick-up apparatus employing the method, which allows for eliminating waste, and reducing the time and cost required for the work by determining the scan area appropriately when images of fine work pieces into which a wafer is divided are to be recognized.

The method for recognizing images of fine work pieces according to the present invention is a method for recognizing fine work pieces, regularly arranged and obtained by dividing a wafer into the shape of grid, wafer by wafer. The method comprises the steps of recognizing images of the fine work pieces by scanning over the first wafer, setting an area constituted by good fine work pieces of the first wafer as a scan area of the second and later wafers based on results of image recognition of the first wafer, and recognizing images by scanning over the second and later wafers.

According to the present invention, when the images of fine work pieces in the wafer are recognized, the scan range of the second and later wafers is determined based on the result of recognizing the image of the first wafer, thereby allowing for limiting the scan range to a smaller one. Accordingly, for example, this allows for the reduction of the time required for the appearance inspection and pick-up processes for semiconductor pellets and the saving of memories required for storing images, thereby realizing said work with high efficiency and at low cost.

THE PREFERRED EMBODIMENTS OF THE INVENTION

Figure 1:
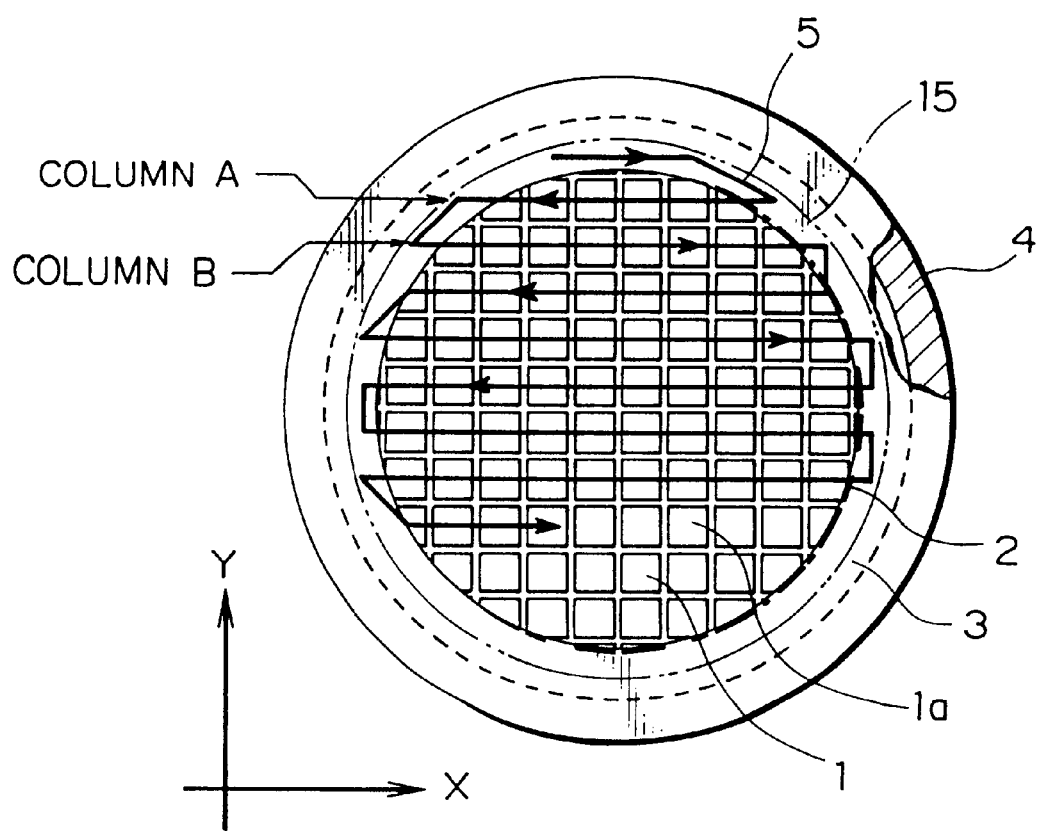
FIG. 1 is a plan view of a wafer showing a conventional scan method.

The preferred embodiments of the present invention are explained below with reference to the accompanying drawings. FIGS. 3 to 6 show the embodiments of the present invention. In FIGS. 3 to 6, the same components as those of FIG. 1 are given the same reference numbers.

Figure 2:
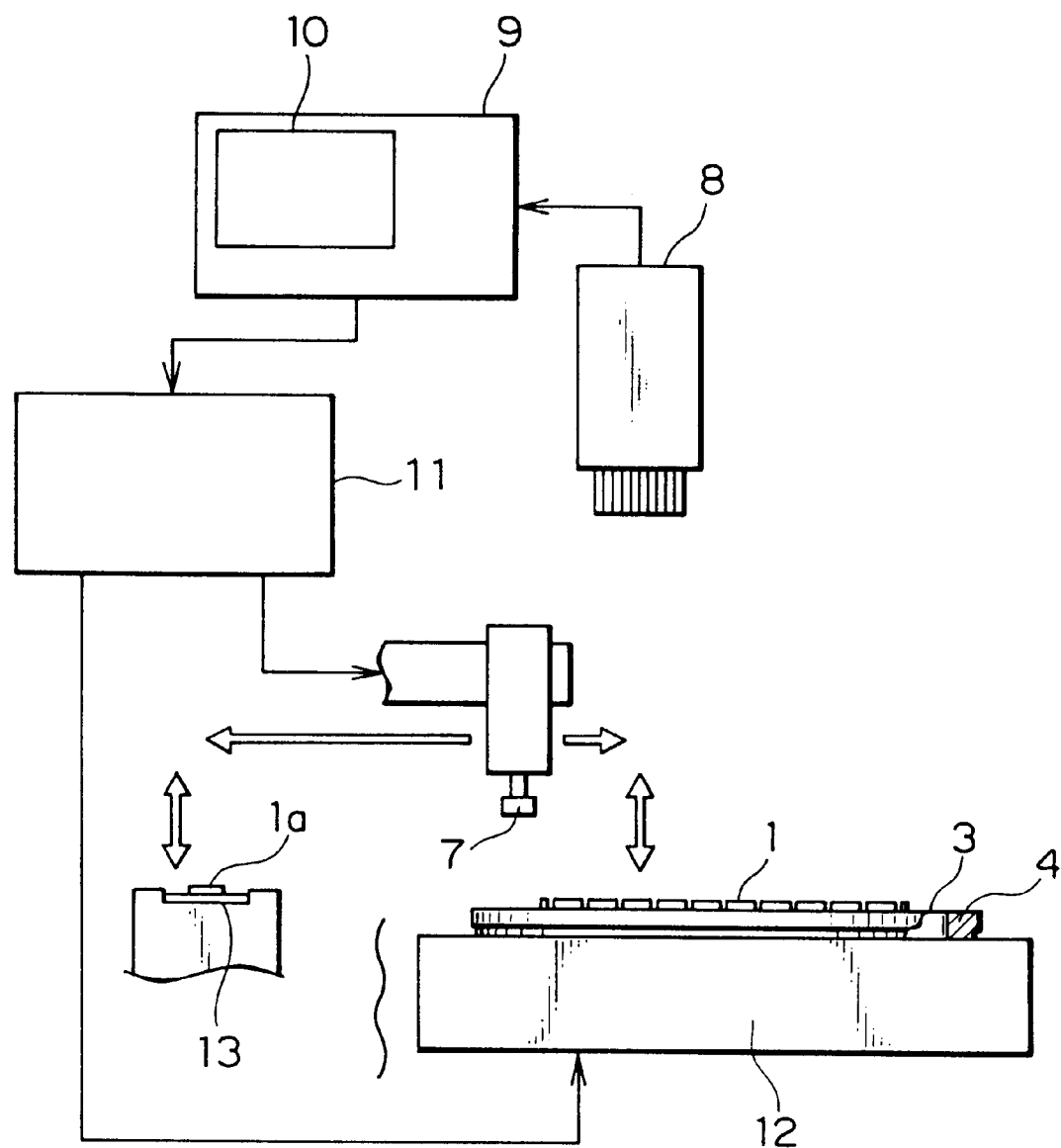
FIG. 2 is a view showing the configuration of an apparatus for the image recognition, appearance inspection, picking up, and mounting of pellets.
Figure 6:
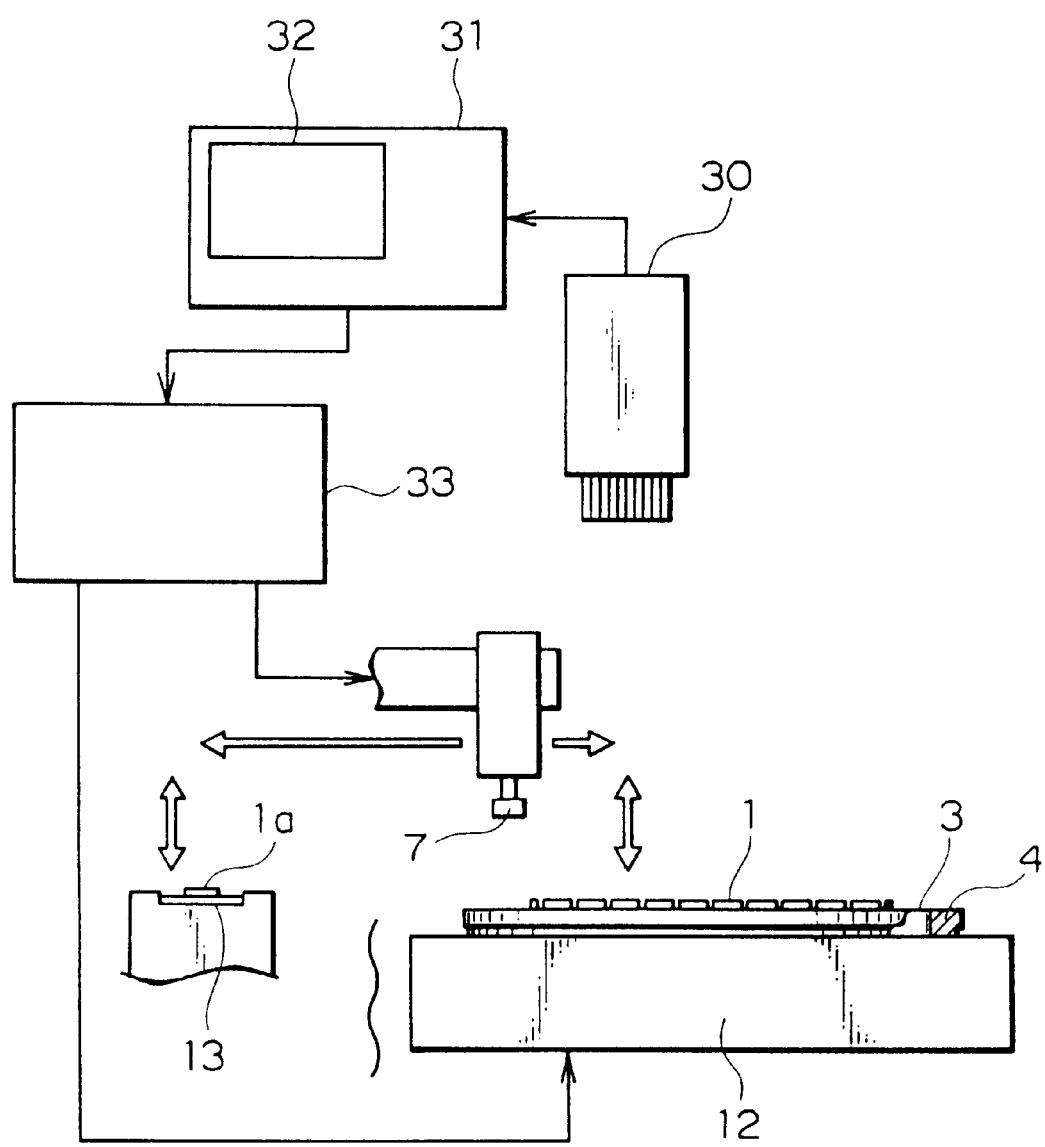
FIG. 6 is a view showing the configuration of an apparatus for the image recognition, appearance inspection, picking up, and mounting of pellets according to an embodiment of the present invention.

In these embodiments, setting of the pickup apparatus shown in FIG. 6 is carried out in accordance with the type of wafers whose image is to be recognized, for example, the size, the type of the product, and changes in specification. After the setting has been completed, two or more wafers of the same type are successively subjected to the appearance inspection and pick-up by image recognition. Incidentally, the pick-up apparatus shown in FIG. 6 is different from the pick-up apparatus shown in FIG. 2 in an image-processing portion 31, an image storage portion 32, and a drive control portion 33.

In the recognition method, the appearance inspection method, and the pick-up method of pellets according to the embodiments, the same methods as conventional ones are employed to image recognize the first wafer. That is, as shown in FIG. 1, the scan area is set to the circle 15 with a predetermined radius larger than that of the wafer 2. That is, the scan is started with the upper edge portion of the circle 15 and then continued in the first column (column A) in the direction of +X. When the scan has reached the circle 15, the scan of the first column is completed. Then, the scan position is shifted by one column in the direction of −Y along the circle 15 and thus the next column (column B) is scanned in the direction of −X, which is opposite to that of the previous column. This scanning pattern is repeated and thus the entire area inside the circle 15 is scanned to image recognize and thus inspect each of the pellets 1. In this appearance inspection, non-shaped pellets 21 that are located on the outer circumference portion and have not rectangular but chipped shapes are not picked up but left on the adhesive sheet 3. Good pellets 1a are picked up by means of the collet 7 and then transported to the lead frame 13 to be mounted thereon.

Figure 3:
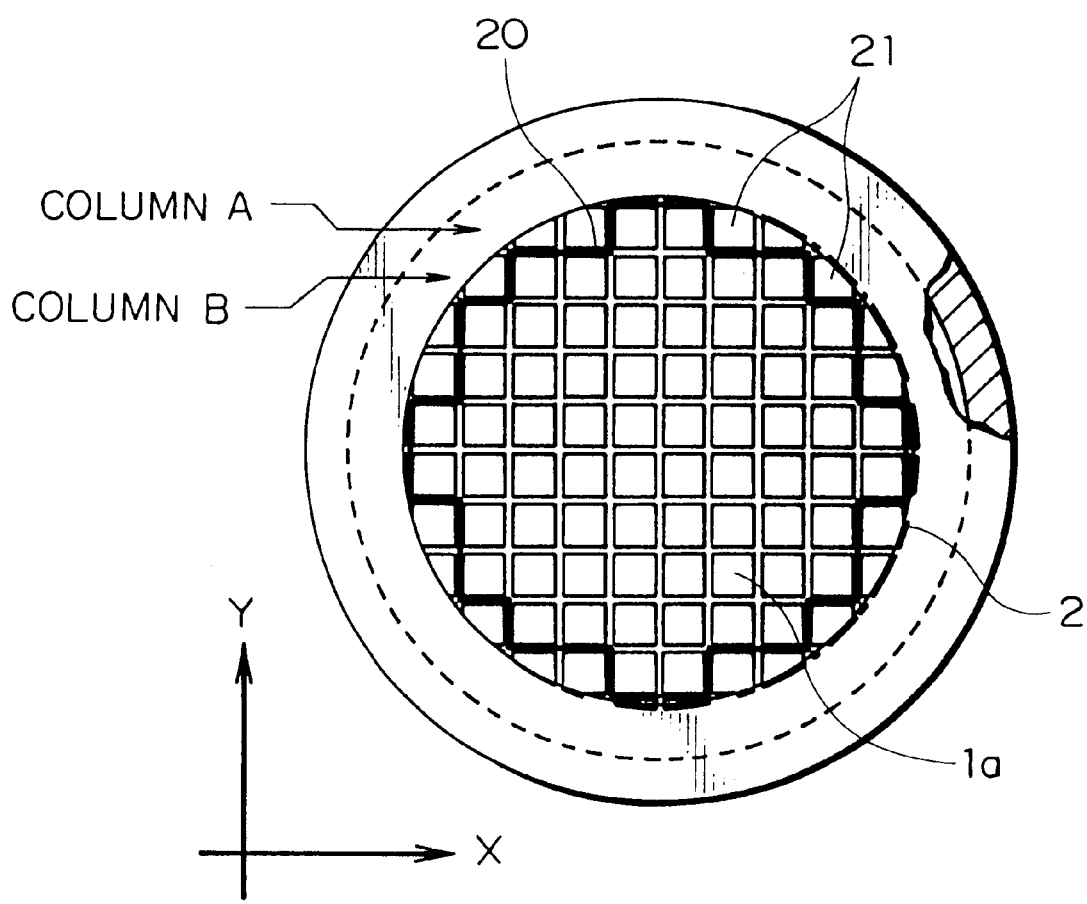
FIG. 3 is a plan view of a wafer showing a scan area in an embodiment of the present invention.

FIG. 3 shows the first wafer in which the appearance inspection has finished. There exist non-shaped pellets 21, which occur inevitably, on the outer circumference portion of the wafer 2. The non-shaped pellets 21 include the outer rim of the circumference of the wafer 2 and are not rectangular but chipped pellets. In FIG. 3, a set of pellets 1 where the non-shaped pellets 21 on the rim portion of the circumference of the wafer are excluded is shown in the area enclosed with a bold line. A polygon 20 defined by the contour indicated by the bold line shows the range where good pellets 1a exist, whereas no good pellets 1a exist in the regions excluded from this polygon 20. Incidentally, pellets inside this polygon 20 are not always good pellets 1a. As will be described later, the pellets also include abnormally shaped ones such as those with drop-off portions, chipping, or cracks.

The image-processing portion 31 of FIG. 6 takes the polygon 20 excluding the non-shaped pellets 21 on the circumference portion of the wafer and then stores the polygon 20 in the image storage portion 32, based on the information regarding image and positional information obtained by the scan over the pellets of the first wafer.

The polygon 20 is a figure symmetrical with respect to a point near the center of the wafer 2. Taking columns A and B of FIG. 3 as an example, two good pellets 1a are found in column A in the direction of X. On the other hand, column B finds six good pellets 1a where two more pellets are found at each of both ends compared with column A.

Figure 4:
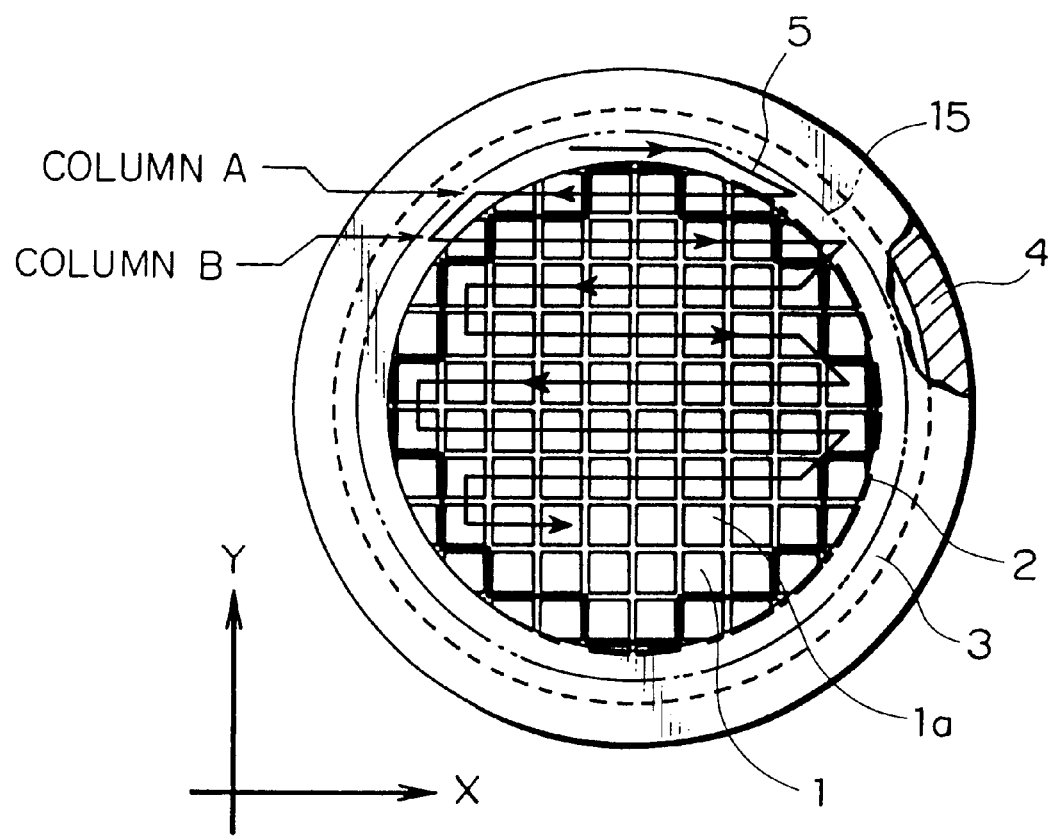
FIG. 4 is a plan view of a wafer showing a method for scanning the second and later wafers according to an embodiment of the present invention.

FIG. 4 shows the method for scanning over the second and later wafers 2. Like the first wafer, the scan is started with the upper edge portion of the circle 15 and then continued in the first column (column A) in the direction of +X. When the scan has reached the circle 15, the scan of the first column is completed. Then, the scan position is shifted by one column in the direction of −Y along the circle 15 and thus the next column (column B) is scanned in the direction of −X, which is opposite to that of the previous column. Thereafter, the wafer 2 is scanned over and subjected to the appearance inspection and pick-up, and the arrangement of the good pellets 1a is stored in the image storage portion 32. In the course of these steps, the following comparison is carried out when it is recognized that the number of good pellets 1a present in a column in the direction of X has changed from that of good pellets 1a present in previous column.

For example, in the case where the second wafer 2 is scanned over as shown FIG. 4, the arrangement of the good pellets 1a in successive columns A and B is compared with the polygon 20 obtained by the image recognition of the first wafer (the wafer scanned over for the first time). Referring to FIG. 4, in the upper (column A) and the subsequent column (column B), the number of good pellets 1a increases, in which only two good pellets 1a are found in column A, whereas column B finds the increased number of 6 good pellets 1a. Moreover, in column B, two more pellets have increased at each of both ends thereof. As such, in the case where the number of good pellets 1a varies in two successive columns, superposition of the number on the polygon 20, shown in FIG. 3, obtained by the first image recognition, shows that it coincides with the portion from column A to column B and allows for determining that it is column A and column B of FIG. 3.

Accordingly, in the scan over the column next to column B, the inside of the circle 15 is not scanned over but the inside of the polygon 20 is scanned over as the scan area. That is, hereafter, the scan area of the pellets 1 is changed from the circle 15 to the polygon 20 where the non-shaped pellets 21 are excluded. Since the area of the polygon 20 is smaller than that of the circle 15, the area of the second and later wafers which is scanned over for image recognition can be reduced, thereby decreasing the time required for the appearance inspection and pick-up. In addition, memories required for storing images can be saved.

As such, in these embodiments, the first wafer is scanned over by the scan method shown in FIG. 1, and the second and later wafers are scanned over by the scan method shown in FIG. 4 to inspect their appearance. In cases where the image-processing portion 31 determines a pellet to be a good pellet 1a, the drive control portion 33 drives the collet 7 to pick up the good pellet 1a. Then, the collet 7 transports the good pellet 1a onto the lead frame 13 to mount it thereon. As shown in FIG. 4, the drive control portion 33 feeds the table 12 by pitches so that the scan area lies within the polygon 20, based on the shape of the polygon 20 stored in the image storage portion 32.

Figure 5:
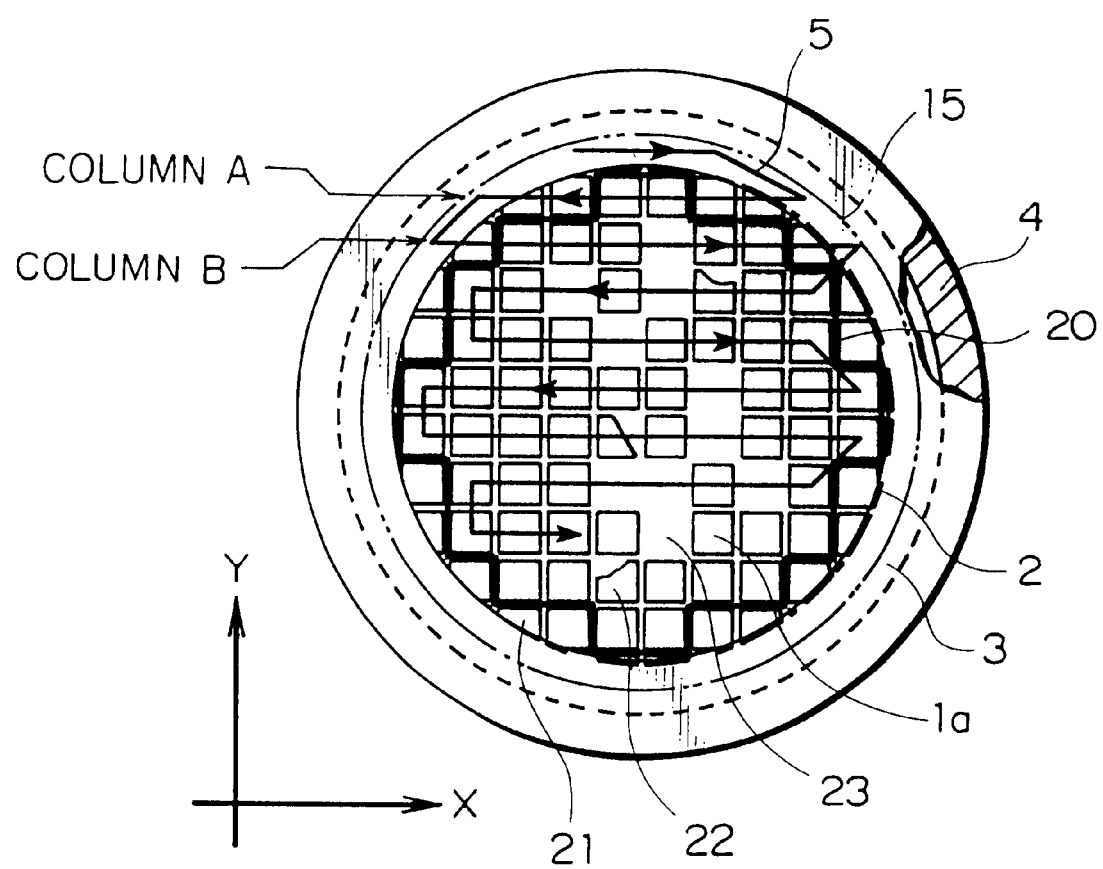
FIG. 5 is a plan view of a wafer showing a method for operating the second and later wafers according to an embodiment of the present invention.

FIG. 5 is a view showing defective pellets present inside the polygon 20 where non-shaped pellets 21 are excluded, in the image recognition by the scan over the first wafer. That is, some of the pellets inside the polygon 20 are abnormally shaped pellets 22 where chipping, cracks, or scratches are found. Some pellets are not present in the grid at pellet drop-off positions 23. Incidentally, arrow 5 in FIG. 5 indicates the scan path over the second and later wafers.

As described above, even in the case where defective pellets (abnormally shaped pellets 22 and pellet drop-off positions 23) are present in the polygon 20, the scan is carried out in the first wafer for image processing over the region inside the circle 15 that has a larger radius than that of the wafer. This allows the non-shaped pellets 21 on the circumference portion of the wafer to be detected, and thus the polygon 20 from which the non-shaped pellets 21 are excluded in the wafer 2 can be found. Therefore, in the second and later wafers, the scan area of the columns following column B lies inside the polygon 20.

That is, for the second and later wafers 2, as shown in FIG. 5, like the first wafer, the scan is started with the upper edge portion of the circle 15 and the first column is scanned over in the direction of +X. When the scan has reached a position of the circle 15, the scan of the first column is completed. Then, the scan position is shifted by one column in the direction of −Y along the circle 15 and thus the next column is scanned in the direction of −X, which is opposite to that of the previous column.

Then, when it has been recognized that the number of good pellets 1a has increased from two to six as the result of the successive scan over columns A and B, the scan area is changed to within the polygon 20 for the subsequent columns as shown by arrow 5 in FIG. 5.

That is, by the time columns A and B have been scanned over, it is obvious from the result of the scan over the first wafer that no good pellets 1a exist outside the polygon 20 in the second and later wafers. Therefore, in the appearance inspection and pick-up of the next and later columns, the scan area can be set not to the circle 15 but to the polygon 20.

Then, in cases where it has been determined that an abnormally shaped or chipped pellet 22, or a pellet drop-off position 23 is found as the result of image processing, by means of the image-processing portion 31 of the image signal that has been obtained by the camera 30 from a pellet portion that is fed sequentially to the position of picking up the image thereof, the drive control portion 33 feeds the table 12 by pitch to move to the neighboring pellet. Then, the collet 7 will pick up the pellet 1a if it is determined that the pellet is good.

As such, for the second and later wafers, the scan area is set to the polygon 20 that is obtained based on the result of image recognition of the first wafer. Since the area of the polygon 20 is smaller than that of the circle 15, the area of the second and later wafers which is scanned over for image recognition can be reduced, thereby decreasing the time required for the appearance inspection and pick-up. In addition, memories required for storing images can be saved.

In the first and second embodiments, the method for recognizing the image of pellets divided from a semiconductor wafer was shown. However, the present invention can also be applied effectively even to other devices divided into the shape of a grid from a wafer, for example, other fine work pieces that are arranged regularly in the X- and Y-directions of a plane, such as capacitor chips.

Furthermore, according to the appearance inspection apparatus or the pick-up apparatus of the present invention, conventional apparatuses need not be changed drastically to allow the range for image recognition to be decreased and thus scanning over unnecessary portions is avoided. This allows a significant reduction in the time required for appearance inspection and pick-up.

Still furthermore, the targets of application of the present invention are not limited to semiconductor wafers, but applicable to cases where image recognition of two or more wafers is performed successively which include a plurality of fine work pieces that are divided in the shape of a grid and regularly arranged.

What is claimed is:

1. A method for recognizing images of fine work pieces, regularly arranged and obtained by dividing a wafer into the shape of a grid, the method comprising the steps of:

recognizing images of the fine work pieces by scanning over a first wafer, setting an area constituted by good fine work pieces of the first wafer based on results of image recognition of the first wafer, said area being used to define an area of the second and later wafers to be scanned, and recognizing images by scanning over the second and later wafers using the area set by the first wafer.

2. The method for recognizing images of fine work pieces according to claim 1, wherein said scan area for scanning said first wafer is inside a circle having a radius larger than that of the wafer, and based on results of recognition of images of the first wafer, fine work pieces located on the circumference rim portion of said circle and including an outer rim of the wafer in the circumference rim of said pieces are regarded as bad pieces of non-shaped fine work pieces to determine a polygon being a contour defining a set constituted by fine work pieces provided by excluding said non-shaped fine work pieces from fine work pieces within said circle, and an area within the polygon is determined as the scan area of the second and later wafers.

3. The method for recognizing images of fine work pieces according to claim 2, wherein when the second and later wafers are scanned over, a plurality of columns are scanned over in a manner such that scanning is carried out over the first column in one direction and then in turn over the second column in the opposite direction in order to recognize the number of good fine work pieces in these columns, when the number of good fine work pieces has changed and the change in the number of the good fine work pieces coincides with a change in the number of good fine work pieces in said polygon determined by scanning of said first wafer, the scan area for subsequent columns is set to be within said polygon.

4. The method for recognizing images of fine work pieces according to claim 3, wherein said fine work pieces are pellets into which a wafer is cut and divided in a dicing process.

5. The method for recognizing images of fine work pieces according to claim 4, wherein said fine work pieces are fixed on an adhesive sheet.

6. The method for recognizing images of fine work pieces according to claim 1, wherein the area of the second and later wafers to be scanned is smaller than the area scanned over the first wafer.

7. A method for recognizing images of fine work pieces according to claim 1, wherein a path of scanning over the second and later wafers is different than a path of scanning over the first wafer.

8. A pick-up apparatus for fine work pieces comprising:
a table, movable in X- and Y-directions, for placing thereon regularly arranged fine work pieces obtained by dividing a wafer in the shape of a grid,
an image pickup unit, disposed above said table, for picking up images of a fine work piece on said table,
an image-processing unit for image processing an image signal taken by said image pickup unit to recognize whether or not the fine work piece is good,
an image storage unit for storing image data of said image-processing unit in conjunction with positional data of the fine work piece,
a collet for picking up a fine work piece on said table and transporting the same to a mounting position, and
a drive control unit for controlling and driving said collet in order to pick up the fine work piece determined to be good by said image-processing unit,
said image-processing unit recognizing good fine work pieces by scanning and image recognition of the first wafer and thereafter setting an area constituted by good fine work pieces of the first wafer, the set area being used to define an area of the second and later wafers to be scanned.

9. The pick-up apparatus for fine work pieces according to claim 8, wherein
in said image-processing unit,
said scan area for scanning said first wafer is inside a circle having a radius larger than that of the wafer, based on results of recognition of images of the first wafer, fine work pieces located on a circumference rim portion of said circle and including an outer rim of the wafer in the circumference rim of said pieces are regarded as bad pieces of non-shaped fine work pieces to determine a polygon being a contour defining a set constituted by fine work pieces provided by excluding said non-shaped fine work pieces from fine work pieces within said circle, and
an area within the polygon is determined as the scan area of the second and later wafers.

10. The pick-up apparatus for fine work pieces according to claim 9, wherein
in said image-processing unit,
when the second and later wafers are scanned over, a plurality of columns are scanned over in a manner such that scanning is carried out over the first column in a direction and then in turn over the second column in the opposite direction in order to recognize the number of good fine work pieces in these columns,
when the number of good fine work pieces has changed and the change in the number of the good fine work pieces coincides with a change in the number of good fine work pieces in said polygon determined by scanning of said first wafer, the scan area for subsequent columns is set to be within said polygon.

11. The pick-up apparatus for fine work pieces according to claim 8, wherein
a wafer ring is provided on said table with the center of said wafer ring being aligned with a reference position on said table, and
said fine work pieces are fixedly adhered to an adhesive sheet adjusted on said wafer ring.

12. The pick-up apparatus for fine work pieces according to claim 8, wherein
said wafer is diced on an adhesive sheet to be divided into fine work pieces and thereafter, when said adhesive sheet is attached to said wafer ring, said adhesive sheet is stretched outwards in the radial direction from the center of said wafer and thereby said fine work pieces are spaced apart from one another.

13. A pick-up apparatus for fine work pieces according to claim 8, wherein the area of the second and later wafers to be scanned is smaller than the area scanned over the first wafer.

14. A pick-up apparatus for fine work pieces according to claim 8, wherein a path of scanning over the second and later wafers is different than a path of scanning over the first wafer.

* * * * *